United States Patent
Scheicher et al.

(10) Patent No.: US 12,132,158 B2
(45) Date of Patent: Oct. 29, 2024

(54) OPTOELECTRONIC COMPONENT WITH A TRANSPARENT BOND BETWEEN TWO JOINING PARTNERS AND METHOD OF MANUFACTURING THE SAME

(71) Applicant: OSRAM Opto Semiconductors GmbH, Regensburg (DE)

(72) Inventors: Richard Scheicher, Thierhaupten (DE); Thomas Huettmayer, Diedorf (DE); Ivar Tangring, Regensburg (DE); Angela Eberhardt, Augsburg (DE); Florian Peskoller, Ingolstadt (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 454 days.

(21) Appl. No.: 17/432,429

(22) PCT Filed: Feb. 13, 2020

(86) PCT No.: PCT/EP2020/053764
§ 371 (c)(1),
(2) Date: Aug. 19, 2021

(87) PCT Pub. No.: WO2020/178000
PCT Pub. Date: Sep. 10, 2020

(65) Prior Publication Data
US 2022/0077369 A1   Mar. 10, 2022

(30) Foreign Application Priority Data
Mar. 7, 2019   (DE) .................. 10 2019 105 831.7

(51) Int. Cl.
*H01L 33/62* (2010.01)
*H01L 33/00* (2010.01)
(Continued)

(52) U.S. Cl.
CPC ............ *H01L 33/62* (2013.01); *H01L 33/005* (2013.01); *H01L 33/22* (2013.01); *H01L 33/44* (2013.01);
(Continued)

(58) Field of Classification Search
CPC ..... H01L 33/005–0095; H01L 33/0008; H01L 33/44; H01L 33/48–56;
(Continued)

(56) References Cited

U.S. PATENT DOCUMENTS 10,233,114 B2   3/2019  Eberhardt et al.
2005/0029513 A1   2/2005  Kawashima et al.
(Continued)

FOREIGN PATENT DOCUMENTS

EP   3007239 A1   4/2016
EP   3439431 A1   2/2019
(Continued)

OTHER PUBLICATIONS

"Ra & RMS: Calculating Surface Roughness", Harrison Electropolishing.*
(Continued)

*Primary Examiner* — Mohammad A Rahman
*Assistant Examiner* — Eric Manuel Mulero Flores
(74) *Attorney, Agent, or Firm* — Slater Matsil, LLP

(57) ABSTRACT

In an embodiment an optoelectronic component includes a first joining partner including an LED chip with a structured light-emitting surface and a compensation layer applied to the light-emitting surface, wherein the compensation layer has a surface facing away from the light-emitting surface and spaced apart from the light-emitting surface, and wherein the surface forms a first connecting surface, a second joining partner having a second connecting surface, the first and second connecting surfaces being arranged such
(Continued)

that they face each other and a bonding layer made of a film of low-melting glass having a layer thickness of not more than 1 μm, wherein the bonding layer bonds the first and second connecting surfaces together, wherein the structure of the light-emitting surface is embedded in the compensation layer, and wherein the first and second connecting surfaces are smooth such that their surface roughness, expressed as center-line roughness, is less than or equal to 50 nm.

14 Claims, 4 Drawing Sheets

(51) Int. Cl.
*H01L 33/22* (2010.01)
*H01L 33/44* (2010.01)
*H01L 33/58* (2010.01)

(52) U.S. Cl.
CPC ...... *H01L 33/58* (2013.01); *H01L 2933/0025* (2013.01); *H01L 2933/0058* (2013.01); *H01L 2933/0066* (2013.01)

(58) Field of Classification Search
CPC . H01L 33/0025–0091; H01L 33/20–22; F21K 9/60–69
See application file for complete search history.

(56) References Cited

U.S. PATENT DOCUMENTS

| | | | |
|---|---|---|---|
| 2010/0051970 A1* | 3/2010 | Ouderkirk | H01L 33/58 438/27 |
| 2012/0112221 A1* | 5/2012 | Lai | H01L 33/44 257/E33.073 |
| 2013/0056725 A1* | 3/2013 | Eberhardt | H01L 33/50 257/E33.013 |
| 2014/0151742 A1* | 6/2014 | Logunov | C03C 4/085 438/26 |
| 2016/0304391 A1 | 10/2016 | Eberhardt et al. | |
| 2017/0040511 A1* | 2/2017 | Lee | H01L 33/52 |
| 2017/0170369 A1* | 6/2017 | Chuang | H01L 33/58 |
| 2018/0258520 A1 | 9/2018 | Kundaliya et al. | |
| 2019/0186711 A1 | 6/2019 | Lenef et al. | |

FOREIGN PATENT DOCUMENTS

| | | |
|---|---|---|
| JP | 2005072129 A | 3/2005 |
| WO | 2015091374 A1 | 6/2015 |
| WO | 2017214464 A1 | 12/2017 |

OTHER PUBLICATIONS

"Ra & RMS: Calculating Surface Roughness", Harrison Electropolishing, retrieved 2024.*
Ariane Ferreira Porto Santo, "Surface Roughness Optimization of SAE 1020 and SAE 1045 Turning Process Using Design of Experiments", Oct. 2020, p. 79073 or p. 6 in PDF viewer.*

* cited by examiner

OPTOELECTRONIC COMPONENT WITH A TRANSPARENT BOND BETWEEN TWO JOINING PARTNERS AND METHOD OF MANUFACTURING THE SAME

This patent application is a national phase filing under section 371 of PCT/EP2020/053764, filed Feb. 13, 2020, which claims the priority of German patent application 102019105831.7, filed Mar. 7, 2019, each of which is incorporated herein by reference in its entirety.

TECHNICAL FIELD

The present invention is in the field of interconnection technologies for optoelectronic devices. In particular, the present invention relates to optoelectronic devices and methods of fabricating such devices using inorganic bonding materials, such as low-melting glasses.

BACKGROUND

Optoelectronic components are known from the prior art which have a support, at least one optoelectronic component being arranged on a surface of the support. If the support is a lead frame and the optoelectronic component is an LED chip (LED stands for "light emitting diode"), this is referred to as an LED component. In such an LED component, an optical lens can be fixed to the LED chip by means of a transparent adhesive.

Such transparent adhesives are usually highly transparent organic materials, such as epoxy resins or silicones, which exhibit minimal light absorption. The problem is that these organic adhesives are not suitable for use in special diode devices with high luminance, such as high-power LED or laser packages. This is due to the fact that these special devices generate a lot of heat during use because of the high power. Organic adhesives cannot withstand such heat in the long term. They degrade, lose transparency, become brittle and crack. This impairs the functionality of the component.

Therefore, in high-performance components, the optically transparent joints between the components are preferably made using a heat-resistant inorganic material such as glass, which also has a high refractive index in order to minimize reflection losses at the interfaces.

In addition, only low-melting glasses can be used for high-performance components whose parts cannot withstand the high temperatures of over 600° C. that are common in glass joining. These include, for example, the so-called LARP (Laser Activated Remote Phosphor) lighting systems, in which a fluorescent ceramic converter must be joined transparently to a dichroic coating of a substrate. A bonding technology for LARP devices is described, for example, in International Application Publication No. Wo 2017/214464 A1.

Another interconnection technology is known from the International Application Publication No. WO 2015/091374 A1. Here, light-transmissive low-melting glass solders are used in the form of a powder verse or a preform. The glass solders are applied to a surface of a component. The component is then heated above the softening temperature $T_{soft}$ of the glass used and bonded to a second component. Heating to a temperature above the softening temperature $T_{soft}$ of the glass ensures that the glass solder liquefies significantly and forms an adhesive layer which can compensate for deviations in the shape of the surfaces to be joined. When the components are joined, this can cause an excess amount of glass to spill over the mounting surface, creating a bulge of glass that is pushed out. This can be undesirable for some applications.

Accordingly, International Application Publication No. WO 2015/091374 A1 discloses a glass composition comprising at least one tellurium oxide having a content of Mg, Ca, Sr, Ba, Zn, Mn and combinations thereof.

By using low melting point glass solders, components can be joined which are provided with heat-sensitive LED chips. The semiconductor layers present in LED chips can easily be damaged if exposed to excessive heat. However, it has been found that even at the comparatively low temperatures required to liquefy low-melting glasses, at least some damage to an LED chip involved in the joining process cannot be ruled out.

In the case of high-power components, there are further requirements for the adhesive coatings used in production.

Since the high-power components generate blue radiation with a very high intensity, optimum heat transfer through the glass adhesive layer must also be ensured. For this purpose, the glass adhesive layer must be applied very evenly and as thinly as possible. This can be achieved, for example, by applying the glass adhesive layer using a vacuum-based coating process (e.g. PVD for "Physical Vapor Deposition") or a thin-film technology. This is the subject of document US 2018/0258520 A1.

SUMMARY

Embodiments provide an optoelectronic component of the type defined above in such a way that it can be manufactured more gently and better. In particular, embodiments exclude possible damage to the semiconductor layers of the LED chip due to excessive heat and/or a reaction with the glass adhesive layer as far as possible during manufacture.

Embodiments provide that the structure of the light-emitting surface is embedded in the compensation layer, and the two connecting surfaces are smooth in such a way that their surface roughness, expressed as the center roughness Ra, is less than or equal to 50 nm, and preferably less than or equal to 10 nm.

Due to the compensation layer and the particularly smooth bonding surfaces, the glass bonding layer no longer has to compensate for virtually any shape deviations. This means that during joining, it is sufficient to heat the glass at least up to the transformation temperature and at most up to the softening temperature. In this temperature range, the glass becomes soft enough to fulfill its adhesive function. A further increase in temperature to soften the glass is not necessary, since there are no significant grooves or ridges in the bonding surfaces into which the glass would have to flow. Thus, both the bond temperature and the thickness of the interconnect layer can be reduced, which on the one hand minimizes possible thermal damage to the semiconductor device and on the other hand results in reduced light absorption of the interconnect layer. In addition, the special smoothness results in low light scattering losses at the interfaces between the interconnect surfaces and the glass interconnect layer. Due to the limited heating of the glass, it has a relatively high viscosity in the softened state. Accordingly, the speed of chemical reactions is reduced, which under certain circumstances can lead to damage to the joining partners.

The structure of the light-emitting surface improves the efficiency of light extraction from the LED chip.

In some embodiments of the optoelectronic component, the structured surface can be created by roughening this surface.

By means of roughening, LED chips can be produced that exhibit increased light output. For example, a plasma etching process can be used to roughen the surface of the LED chip or the light-emitting semiconductor layers. In some embodiments, the roughening or structuring of semiconductor layers can also be performed by deposition onto a rough surface.

By applying a levelling layer, the structuring can be filled and thus levelled. In this case, the levelling layer then forms the joining surface of the joining partner.

The two joint surfaces of the joining partners can be smoothed by means of chemical-mechanical polishing (CMP method).

Smoothing is generally understood to mean the levelling of waves, grooves or scores on the joint surface of the mating part to be joined, which can occur during its manufacture. Smoothing may be accomplished by grinding and/or polishing.

In some embodiments, the smoothing layer of the first joining partner may comprise a dielectric.

By dielectric is meant a material that is a non-conductive insulating material, which is in a solid form after being applied to the structured surface. The role of the compensation layer is to compensate for the shape deviations of the structured surface and to seal it. As a result, the thickness of the compound layer used can be significantly reduced.

For efficient light extraction, it is advantageous if the refractive indices $n_d$ of the two materials (LED semiconductor layer and compensating layer) differ, preferably by at least 0.3, better by 0.5.

The dielectric is preferably amorphous or a single-crystal and can be selected, for example, from a material of the following group: $SiO_2$, $Al_2O_3$, $ZrO_2$, $TiO_2$, $HfO_2$, MgO, $Nb_2O_5$, $Ta_2O_5$, $Si_3N_4$, ZnO, SiON (in the form of a mixture between $SiO_2$ and $Si_3N_4$).

ITO (Indium Tin Oxide) can be used as a material for a compensation layer. ITO absorbs short wavelength light, especially blue or shorter wavelength light. ITO can provide an electrically conductive compensation layer. This can be used in particular for InGaAlP or for InGaN thin-film chips. Concepts for such chips are available.

Ideally, a material whose refractive index lies between that of the two adjacent materials is used for the compensating layer, since this is particularly advantageous for the efficiency of light extraction. Since the light-emitting semiconductor layers are very highly refractive and generally have a refractive index >2, aluminum oxide ($Al_2O_3$) in particular is well suited as a dielectric because it has a refractive index nd of about 1.8. In addition, it has a high transmittance for infrared to ultraviolet radiation and a thermal expansion coefficient similar to that of the semiconductor layer, resulting in good thermal shock resistance. Furthermore, the aluminum oxide has a good thermal conductivity and a softening temperature that is above the softening temperature of the low-melting glass. This ensures that the compensation layer retains its strength when the two joining partners are bonded together.

Other materials that are transparent to light and whose softening temperature is above the softening temperature of the low-melting point glass used as the bonding layer can also be used as compensating materials.

In a particular embodiment, the compensating layer can also consist of several layers.

In an exemplary embodiment, the second joining partner can be in the form of an optical component, for example a lens, a conversion element (such as a conversion ceramic, luminescent material in glass) or a transmission ceramic or also a transparent crystal such as sapphire.

A conversion element of an exemplary optoelectronic device may be designed to convert the primary radiation emerging from the LED chip into a secondary radiation having one or more wavelengths different from the primary radiation.

A transmission ceramic as well as a transparent crystal such as sapphire, on the other hand, may be used in optical devices when a certain light transmittance of the second joining partner is desired.

In particular, a lens or a ceramic can be mounted on the LED chip by means of a transparent joining layer made of a low-melting glass. This allows these joining partners to be firmly bonded to each other. The bonding layer thereby acts as an adhesive layer.

In further embodiments, the second joining partner can be a substrate material, which is preferably formed from sapphire.

Furthermore, an epitaxial layer forming the LED chip can be mounted on a sapphire support. The epitaxial layers used as joining partners are epitaxially grown or epitaxially produced single-crystalline layers of a solid. For example, epitaxial layers can thus be joined to a substrate which normally cannot grow epitaxially on that substrate, such as an InGaAlP layer on a sapphire substrate.

The interconnect layer disclosed herein in the form of a low-melting point glass may be a transparent glass composition.

According to one embodiment, the low-melting glass is also highly refractive and has a refractive index $n_d$>1.6, more preferably >1.7, ideally ≥1.8, particularly preferably ≥1.9.

According to one embodiment, the glass composition may be colorless and absorb none or at most 1 to 5% of the incident electromagnetic radiation from the first joining partner. In other embodiments, the glass composition may be radiation-transmissive, i.e. transmit more than 95% or more than 99% of the incident electromagnetic radiation towards the second bonding surface of the second joining partner. The glass composition can be free of any scattering.

The low-melting glass composition may comprise, for example, lead oxide (PbO) or bismuth oxide ($Bi_2O_3$) or germanium oxide ($GeO_2$).

The low-melting glass composition may comprise, for example, telluroxide ($TeO_2$).

The glass composition may comprise, for example, tellurium oxide in a proportion of at least 45 mol % and at most 90 mol %, more preferably at least 50 mol % and at most 70 mol %, preferably at least 55 mol % and at most 70 mol %, ideally at least 59 mol % and at most 69 mol %. It may further comprise the oxide of at least one of the following elements: Mg, Ca, Sr, Ba, Zn, Mn, Li, Na, K, Ag, Al, Ga, In, Bi, Sc, Y, La, rare earths, Ti, Zr, Hf, Nb, Ta.

In one embodiment, the glass composition is free of boron trioxide, germanium oxide, lead oxide, phosphates, halogenides, $P_2O_5$, silica, and silicates.

The low melting point glass may have a softening temperature $T_{soft}$ of at most 350° C., preferably at most 320° C. or 300° C. or 270° C. or 250° C., but at least of 200° C.

This has the advantage that the glass composition can bond the two joining partners together even at these low temperatures. Thus, temperature-sensitive joining partners of an optoelectronic component can be bonded in a particularly gentle manner.

The softening temperature $T_{soft}$ of a glass is the temperature at which the viscosity η of the glass being heated has dropped to log η=7.6 dPa*s. The softening temperature $T_{soft}$ is determined according to DIN ISO 7884-6. According to this standard, it is also called the Littleton temperature and is a guide value for the temperature above which the glass is suitable for the majority of forming processes.

At the transformation temperature $T_g$, the viscosity q of the glass is approximately log η=13.3 dPa*s. The transformation temperature $T_g$ is determined in accordance with DIN ISO 7884-8 and, according to this standard, characterizes a certain transformation range from the brittle-elastic state (at low temperature) to the viscous state (at high temperature) of glass.

The present low-melting glass composition can have a refractive index of at least nd=1.8, better of at least nd=1.85, ideally of at least nd=1.90, in particular of at least nd=1.93, particularly preferably of at least nd=1.94, the refractive index depending on the glass composition, e.g. on the content of tellurium oxide.

The glass composition can, for example, have a thermal expansion coefficient in the temperature range from 25° C. to 250° C. of about CTE=19.9*10-6 K-1.

Preferably, the bonding layer is applied to at least one bonding surface of the two joining partners by means of a PVD method. A sputtering method, preferably an HF sputtering method, can be used for this purpose.

A PVD method is a physical vapor deposition method.

In the PVD method disclosed here, a low-melting glass in the form of a solid is used as the starting material. Glass atoms are released from this starting material by bombardment, e.g. with laser beams or magnetically deflected ions or electrons, and converted into a gaseous phase. The gaseous material is then directed onto the joining surface of the joining partner to be coated, where it condenses and forms a very thin joining layer of low-melting glass.

In a sputtering method, also known as cathode sputtering, the atoms of the low-melting glass are released from the solid by bombardment with high-energy ions (mainly noble gas ions such as argon).

High-frequency sputtering (RF sputtering), in which a high-frequency alternating field is applied instead of a DC electric field, is particularly suitable for coating the joining partners disclosed herein. This results in a pressure reduction to 1-20*10-3 mbar at the same sputtering rate. The pressure reduction enables the deposition of thin compound layers with a special microstructure without heating up the joining partner to be coated. This makes HF sputtering particularly suitable for coating heat-sensitive components.

The joining layer applied to the joining surfaces of the joining partners by means of a PVD method can be in the form of a glass film with a maximum layer thickness of 5 μm, preferably 3 μm, if it has not been deposited as a compact layer, for example.

After the joining partners have been joined, i.e. on the finished component, the layer thickness of the glass composition according to at least one embodiment can be between 10-1000 nm, in particular between 100-800 nm, particularly preferably between 200-500 nm (limits included in each case). Quite preferably, the layer thickness is between 10 and 100 nm. The use of an ultrathin transparent glass film as an adhesive for joining components of an optoelectronic device ensures both better thermal bonding and reduced light absorption of this bonding layer. This in turn results in increased efficiency and light output of the optoelectronic device.

In addition, the embodiment of invention relate to a method for manufacturing the optoelectronic component disclosed herein with two joining partners. The method comprises the following steps:

a) coating the structured light-emitting surface with the compensation layer and smoothing the compensation layer to the desired waviness and surface roughness in order to produce the first bonding surface;

b) smoothing the second bonding surface to the desired waviness and surface roughness;

c) coating at least one of the smoothed bonding surfaces of the joining partners with a low-melting glass, preferably by means of a PVD method;

d) joining the two joining partners to each other by:
  i) heating the two joining partners to a temperature T, where $T_g \leq T \leq T_{soft}$, $T_g$ is the transformation temperature and $T_{soft}$ is the softening temperature of the low-melting glass, and
  ii) placing the joining partners on top of one another so that a bond is formed between the two joining surfaces and the low-melting glass, the placing on top of one another preferably being carried out with the application of weight, steps i) and ii) being carried out in any order.

The present method for producing an optoelectronic component basically comprises two sub-processes, namely the bonding of the two joining partners described in steps a) to c) and their subsequent bonding to one another, known as bonding.

The bonding of the joining partners can take place under vacuum, for example. This leads to a strong bond between the bonding layer and the joining partners.

Bonding can also be carried out under weight or pressure at, for example, about 5-10 MPa. This allows any first-order shape deviations, such as unevenness of the bonding surfaces, to be compensated for during the bonding process.

The fully assembled optoelectronic component can then be cooled while still being subjected to weight.

Furthermore, it is possible that the two joining partners are first placed on top of each other, then heated and then joined together. The joining can also be carried out dynamically.

The technical terms used in the present application, such as waviness, surface roughness, unevenness, etc., to characterize the profile of surfaces correspond to the DIN 4760 standard, which classifies deviations in the shape of surfaces into six orders. Reference is made to this standard with regard to the definitions of terms and the relevant metrological methods for quantifying surface properties.

BRIEF DESCRIPTION OF THE DRAWINGS

Exemplary embodiments of the invention are now described with reference to the drawings, wherein.

DETAILED DESCRIPTION OF ILLUSTRATIVE EMBODIMENTS

In the following description, exemplary embodiments of the present invention are described with reference to the drawings. The drawings are not necessarily to scale, but are merely intended to illustrate the respective features schematically.

It should be noted that the features and components described below may each be combined with one another, regardless of whether they have been described in connection with a single embodiment. The combination of features in the respective embodiments serves only to illustrate the basic structure and operation of the claimed device.

The manufacturing processes shown schematically in FIGS. 1-4 each involve the bonding of two exemplary joining partners of an optoelectronic component to one another.

Figure 1:
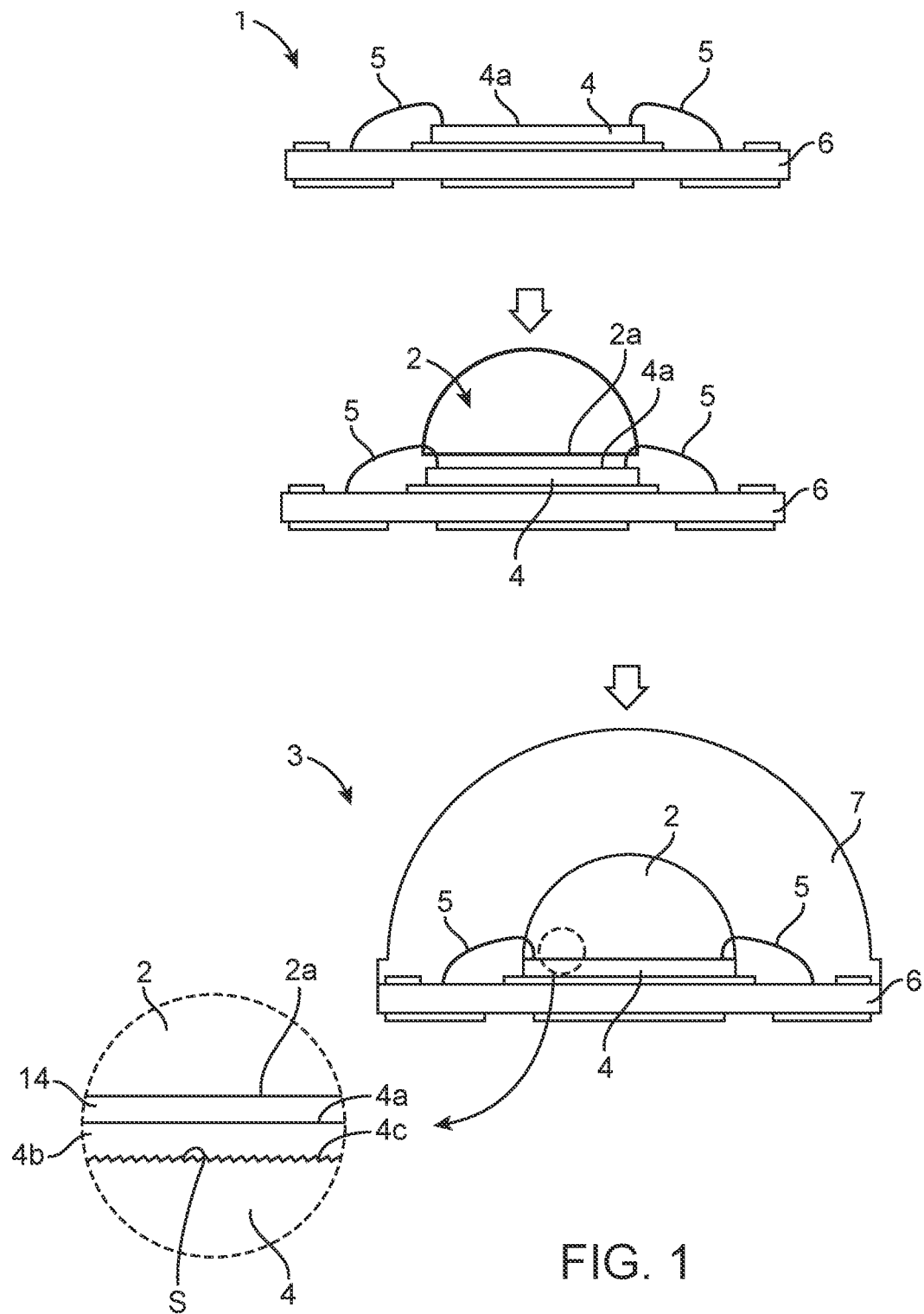
FIG. 1 represents a manufacturing method of a first optoelectronic component.

FIG. 1 shows an exemplary manufacturing process of an optoelectronic component 3 in which an optical joining partner 2 is mounted on an optoelectronic joining partner 1. The component 3 here is a typical LED package including focusing lenses.

In an upper section of FIG. 1, the first joining partner 1 of the optoelectronic component 3 is shown. It comprises a carrier 6, which may for example be a ceramic substrate. The carrier 6 can also be referred to as the base of the first joining partner 1. It preferably consists of a material with good thermal conductivity, such as $Al_2O_3$ or AlN.

An optoelectronic component 4, such as an LED chip (light emitting diode chip), is arranged on the carrier 6. The LED chip 4 comprises a plurality of semiconductor layers (epitaxy layers), wherein light in a certain wavelength range is generated in an active layer during operation of the LED chip 4. For example, the LED chip 4 can generate red light.

The LED chip 4 has a patterned light-emitting surface 4c and a compensation layer 4b applied to the light-emitting surface 4c. This is illustrated in the magnification in the lower part of FIG. 1. A surface 4a of the compensation layer 4b facing away from and spaced apart from the light-emitting surface 4c forms a first connection surface of the first joining partner 1. Light can pass out of the LED chip 4 through the connection surface 4a. As a material for the compensation layer 4b, for example, amorphous silicon dioxide or aluminum oxide can be used. As can be seen in the enlargement of FIG. 1, the texture S of the light emitting surface 4c is embedded in the compensation layer 4b. That is, the texture of the structure S is levelled by the levelling layer 4b. The compensation layer 4b serves to encapsulate the structure S in such a way that it can no longer influence the quality of a connection between the LED chip 4 and another component.

Via electrical lines 5 in the form of bonding wires, which run from a respective bonding pad next to the first connection surface 4a of the LED chip 4 to a respective electrical contact point on the carrier 6, power can be supplied to the LED chip 4.

For the purpose of manufacturing the optoelectronic component 3, a second bonding partner 2, which is present, for example, in the form of a prefabricated hemispherical lens, is permanently bonded to the LED chip 4 by means of a thin bonding layer 14 of low-melting glass. For this purpose, the lens 2 has a second bonding surface 2a. The second bonding surface 2a of the lens 2 is arranged facing the first bonding surface 4a of the first joining partner 1, so that the two bonding surfaces 2a, 4a can be bonded together.

According to embodiments of the invention, the two bonding surfaces 4a, 2a are smooth such that their waviness, expressed as mean waviness Wa, is less than or equal to 500 nm and their surface roughness, expressed as center roughness Ra, is less than or equal to 50 nm, and preferably less than or equal to 10 nm.

In some embodiments, a lens 2 may be selected whose coefficient of thermal expansion is equal to the coefficient of thermal expansion of the LED chip 4. Thus, it can be ensured that the two joining partners 1, 2 will have similar expansion behavior when heated and cooled during bonding. This prevents the bond from bending or breaking again after joining with cooling.

The bonding layer 14 of a low-melting glass is applied by a PVD process, for example by HF sputtering, as an ultrathin film, preferably with a layer thickness of max. 5 µm, particularly preferably max. 3 µm, very particularly preferably max. 1 µm, to at least one of the two bonding surfaces 2a, 4a of the joining partners 1, 2. Both joining partners 1, 2 are then heated to a softening temperature of the low-melting glass, which is preferably lower than 350° C., and placed one on top of the other so that a permanent bond can be formed.

The heating of the two joining partners 1, 2 is deliberately limited to the softening temperature of the low-melting glass layer 14. This protects the heat-sensitive semiconducting layers of the LED chip 4. Since the two bonding surfaces 4a, 2a are very smooth according to embodiments of the invention, it is sufficient for bonding that the glass layer 14 becomes soft. It does not have to liquefy, since there are no significant shape deviations in the two bonding surfaces 4a, 2a that would have to be compensated for by the glass layer 14 acting as an adhesive layer.

This does not exclude the possibility that the applied glass layer may also have been heated to a higher temperature, for example to the flow temperature of the glass, before bonding in order to produce a pore-free layer. In this case, the glass layer would be on a temperature-resistant joining partner such as a glass lens.

The lower section of FIG. 1 shows a finished optoelectronic component 3 in which two lenses 2, 7 are provided. Here, the lens 2 is formed as an inner lens of the component 3, which completely covers the connection surface 4a of the LED chip 4. The inner lens 2 may be formed of glass, for example. Preferably, such a glass lens 2 may have a light refractive index nL1 that is lower than the light refractive index nG of the low-melting glass. This can significantly improve the light extraction rate of the optoelectronic component.

The second lens 7 is an outer lens which, similar to the lens 2 on the LED chip 4, completely encloses the entire upper surface of the carrier 6 with the components located thereon. The outer lens 7 can, for example, be made of a silicone and have a lower refractive index nL2 than the inner lens 2. Thus it can be used as a focusing lens.

Advantageously, the refractive index nG of the glass layer 14 should be between the refractive index nC of the semiconductive material of the LED chip 4 and the refractive index nL1 of the glass lens 2. In a particularly preferred variant, the following relationship applies to the refractive indices:

$$nair < nL2 < nL1 < nG < nC$$

where nair is the refractive index of the air surrounding the device 3, nL2 is the refractive index of the outer lens 7, nL1 is the refractive index of the inner lens 2, nG is the refractive index of the glass adhesive layer 14, and nC is the refractive index of the semiconductor material of the LED chip 4. When this ratio is maintained, the light extraction efficiency of the device 3 is particularly high. It is of particular advantage if the jump in the refractive index from one material to another is essentially the same for all material transitions.

Figure 2:
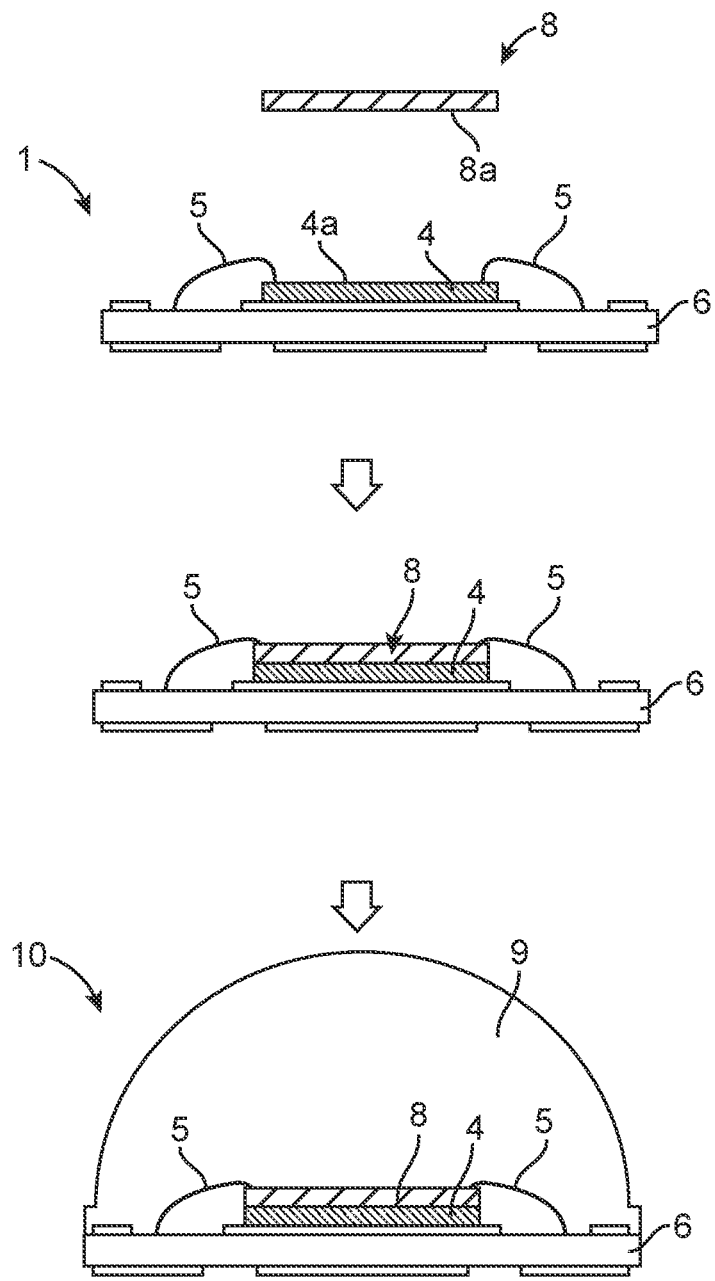
FIG. 2 shows a manufacturing process of a second optoelectronic component.

FIG. 2 shows an exemplary manufacturing process of a second optoelectronic component 10 according to the embodiments of the invention, which also comprises an optoelectronic joining partner 1 and a further optical joining partner 8. This is an LED package 10 including a converter and a lens for generating white light.

In the following, only the differences to the embodiment according to FIG. 1 are described. With regard to the similarities, reference is made to what has been said above.

The joining partner 1 is an LED chip 4 together with carrier 6, which has a first smooth joining surface 4a. The LED chip 4 may emit blue light, for example.

The second joining partner 8 shown in FIG. 2 is a conversion ceramic which also has a second smooth joining surface 8a.

The manufacturing process of the optoelectronic component 10 corresponds to the manufacturing process of the first component 3 according to embodiments of the invention. Here, too, the two joining partners 1, 8 are arranged in such a way that their smooth joining surfaces 4a, 8a can be joined along the complete contact surface by means of a thin film 14 of a low-melting glass.

The conversion element 8 may comprise a conversion material, such as a phosphor, by means of which the light emitted from the LED chip 4 and transmitted through the bonding layer 14 can be converted into light of a different wavelength. The optoelectronic device 10 may further comprise an outer lens 9. The lens 9 may be formed of silicone, for example, and may have a lower refractive index compared to the conversion element 8 and the LED chip 4.

In alternative embodiments of the optoelectronic device 10, the LED chip 4 may be a so-called flip chip. In this case, the active contacting side of the chip is mounted directly on the substrate 6, preferably made of sapphire, without any connecting wires 5. This allows the entire surface of a piece (die) of a semiconductor wafer to be used for contacting. In the flip-chip bonding technique, the connection of all contacts takes place simultaneously. This results in a time saving.

Figure 3:
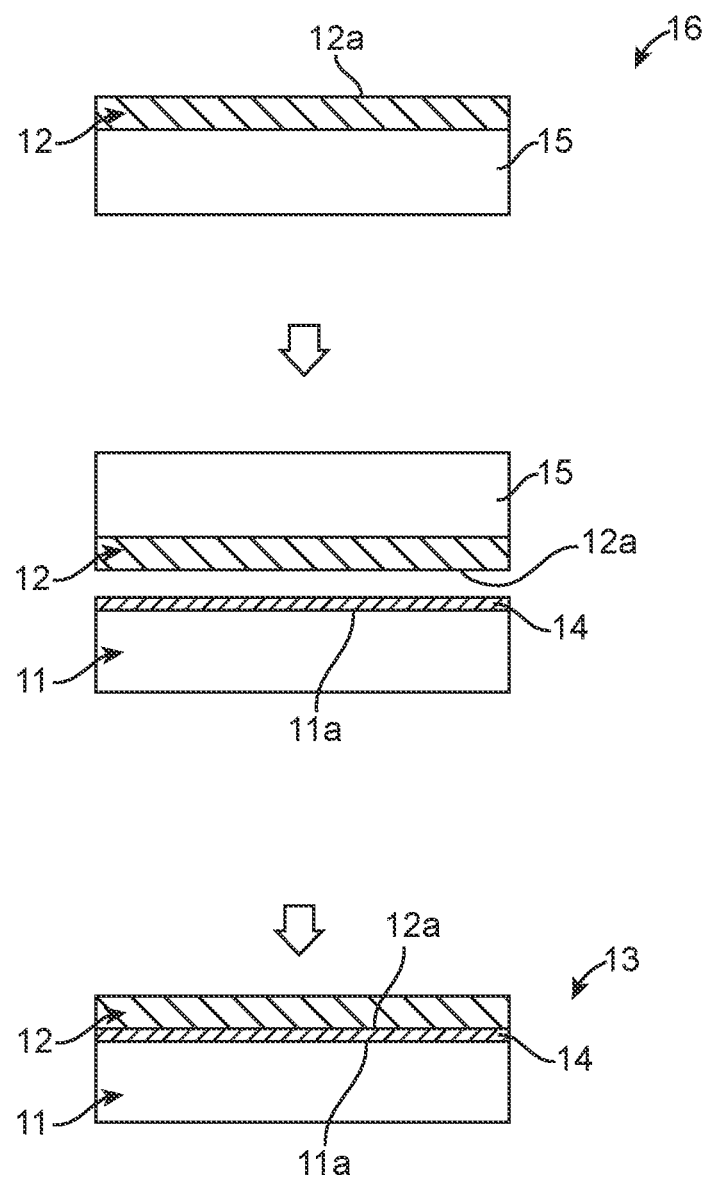
FIG. 3 shows a manufacturing process of a third optoelectronic component ion.

FIG. 3 shows an exemplary manufacturing process of a third optoelectronic component 13 according to embodiments of the invention, which comprises a first joining partner 12 and a second joining partner 11. This example is a combination of an LED chip and a crystal to improve light extraction.

The second joining partner 11 is a substrate, preferably made of sapphire ($Al_2O_3$). The sapphire substrate 11 comprises a smooth surface forming a second joining surface 11a.

The first joining partner 12 is an LED chip. The LED chip 12 is in the form of crystalline layers of, for example, AlInGaP grown by epitaxy on a substrate 15, preferably a substrate of gallium arsenide (GaAs) or gallium phosphide (GaP). Thus, an intermediate 16 is formed.

The substrate 15 serves as a support element for the AlInGaP epitaxial layer 12, which greatly simplifies the transfer of the AlInGaP epitaxial layer 12 to other substrates on which it cannot grow.

Like all of the first joining partners disclosed herein, the LED chip 12 also has a patterned surface with a compensating layer deposited thereon (not shown). The compensation layer may comprise amorphous $Al_2O_3$.

The optoelectronic component 13 is manufactured by bonding the epitaxially generated AlInGaP layer 12 of the intermediate product 16 to the substrate 11 by means of a bonding layer 14 made of a never-fusing glass.

For this purpose, the substrate 11 has the second smooth bonding surface 11a, while the epitaxial layer 12 has a first bonding surface 12a which has also been smoothed. For the purpose of creating a bond between these two joining partners 11, 12, a bonding layer 14 in the form of a low-melting glass, such as tellurite glass, is applied to at least one of the two bonding surfaces 11a, 12a.

In the embodiment shown in FIG. 3, the glass bonding layer 14 was applied to the bonding surface 11a of the substrate 11 by a PVD process. Subsequently, both the intermediate product 16 and the substrate 11 are heated to a softening temperature of the low melting point glass 14. Thereafter, the intermediate product 16 is arranged on the bonding layer 14 in such a way that the bonding surface 12a can be completely wetted with the low-melting glass and, preferably under the action of force, a homogeneous and gas bubble-free bond with a layer thickness of at most 1 μm can be formed.

It may be particularly advantageous to use glass bonding layers 14 which have a higher refractive index than the sapphire substrate 11.

In a further step, the optoelectronic component 13 is cooled and the substrate 15 is removed from the epitaxial layer 12. The light is extracted via the sapphire substrate 11.

Figure 4:
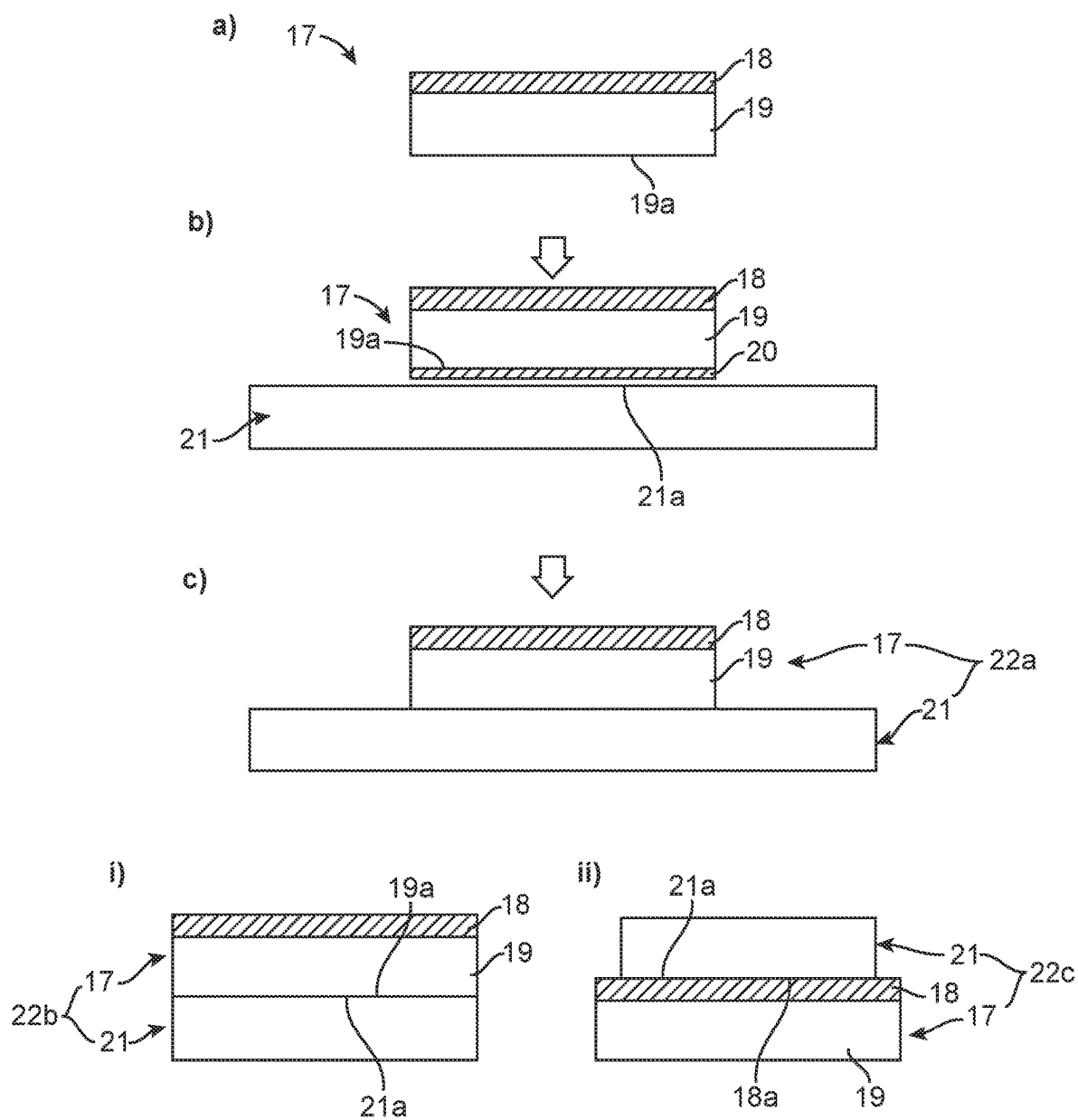
FIG. 4 shows a manufacturing process of three variants of a fourth optoelectronic component.

FIG. 4 shows an exemplary manufacturing process of a fourth optoelectronic device 22 according to embodiments of the invention. Here, it is again a matter of bonding an LED chip to a transparent crystal in order to maximize the light extraction from the LED chip. The device 22 is here realized in three different variants 22a, 22b and 22c.

The fabrication process comprises the three steps marked a) to c). The optoelectronic component 22 comprises a second joining partner 21 in the form of a sapphire substrate and a first joining partner 17 in the form of a sapphire layer 19 with an LED chip 18.

Each of the two joining partners 17, 21 has a smooth joining surface 19a and 21a, respectively. In variants 22a and 22b, the sapphire layer 19 forms the compensation layer in which the structure of the light-emitting surface of the LED chip 18 is embedded. In variant 22c, on the other hand, the first joining partner 17 has an additional compensating layer (not shown) on the LED chip 18, which, viewed from the LED chip 18, is located on the side opposite the sapphire layer 19.

The optoelectronic component 22 is manufactured by joining the sapphire substrate 21 to the first joining partner 17. For this purpose, a thin bonding layer 20 of a low-melting glass can be applied, for example by sputtering, to a bonding surface 19a of the sapphire layer 19 or a bonding surface 18a of the compensation layer (not shown) on the LED chip 18. Alternatively, the glass bonding layer 20 can be applied to the second bonding surface 21a of the substrate 21 or to both bonding surfaces 19a, 21a or 18a, 21a.

Step a) shows the sapphire layer 19 before the sputtering of the glass bonding layer 20. Step b) shows the bonding of the two bonding partners 17 and 21. Step c) shows the finished end product.

This bonding process produces an ultra-thin transparent bond between the sapphire layer 19 and the sapphire substrate 21. This results in an LED device 22 with an enlarged light extraction area. The increased sapphire volume results in increased light extraction efficiency. In addition, heat dissipation can be improved as a result.

Figures i) and ii) in FIG. 4 show the second and third variants. In variant 22b according to illustration i), the sapphire layer 19 and the sapphire substrate 21 have essentially the same width in contrast to the optoelectronic component 22a.

In the variant 22c according to illustration ii), the LED chip 18 is enclosed by sapphire on two opposite sides. This increases the light extraction in two directions.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. An optoelectronic component comprising:
   a first joining partner comprising an LED chip with a structured light-emitting surface and a compensation layer applied to the light-emitting surface, wherein the compensation layer has a surface facing away from the light-emitting surface and spaced apart from the light-emitting surface, and wherein the surface forms a first connecting surface;
   a second joining partner having a second connecting surface, the first and second connecting surfaces being arranged so that they face each other; and
   a bonding layer made of a film of low-melting glass having a layer thickness of not more than 1 μm, wherein the bonding layer bonds the first and second connecting surfaces together,
   wherein a structure of the light-emitting surface is encapsulated within the compensation layer such that the structure of the light-emitting surface is vertically displaced from a top surface of the compensation layer,
   wherein the first and second connecting surfaces are smooth such that their surface roughness, expressed as center-line roughness, is less than or equal to 50 nm,
   wherein the LED chip comprises a semiconductor layer having the light-emitting surface,
   wherein a refractive index of the compensation layer is smaller than a refractive index of the semiconductor layer and greater than a refractive index of a material forming the second joining partner.

2. The optoelectronic component according to claim 1, wherein the structure of the light-emitting surface is formed by roughening this surface.

3. The optoelectronic component according to claim 1, wherein the first and second connecting surfaces are smoothed by a CMP process.

4. The optoelectronic component according to claim 1, wherein the compensation layer comprises a dielectric.

5. The optoelectronic component according to claim 4, wherein the dielectric comprises a material selected from the group consisting of $SiO_2$, $Al_2O_3$, $ZrO_2$, $TiO_2$, $HfO_2$, MgO, $Nb_2O_5$, $Ta_2O_5$, $Si_3N_4$, ZnO and SiON.

6. The optoelectronic component according to claim 1, wherein the second joining partner is a lens, a conversion element, a transmission ceramic or a transparent single crystal.

7. The optoelectronic component according to claim 1, wherein the second joining partner is a transparent substrate.

8. The optoelectronic component according to claim 1, wherein the low-melting glass is a transparent glass composition with a refractive index greater than 1.7.

9. The optoelectronic component according to claim 8, wherein the glass composition comprises tellurium oxide $TeO_2$.

10. The optoelectronic component according to claim 8, wherein the low-melting glass has a softening temperature of at most 350° C.

11. The optoelectronic component according to claim 1, wherein the bonding layer is applied by a PVD process to at least one of the first and second connecting surfaces of the joining partners and subsequently heated to its softening temperature for bonding.

12. The optoelectronic component according to claim 11, wherein the PVD process is a sputtering process.

13. The optoelectronic component according to claim 1, wherein the bonding layer is a glass film.

14. A method for manufacturing the optoelectronic component with the two joining partners according to claim 1, the method comprising:
    coating the structured light emitting surface with the compensation layer and smoothing the compensation layer to the surface roughness for producing the first connecting surface;
    smoothing the second connecting surface to the surface roughness;
    coating at least one of the smoothed connecting surfaces of the joining partners with the low-melting glass; and
    joining the joining partners to each other by:
        heating the joining partners to a temperature T, where $T_g \leq T \leq T_{soft}$, and where $T_g$ is a transformation temperature and $T_{soft}$ is a softening temperature of the low-melting glass; and
        placing the joining partners one on top of the other so that a bond is formed between the first and second connecting surfaces and the low-melting glass, wherein placing one on top of the other is performed with application of a weight.

* * * * *